United States Patent [19]

Liu et al.

[11] Patent Number: 5,212,108
[45] Date of Patent: May 18, 1993

[54] FABRICATION OF STABILIZED POLYSILICON RESISTORS FOR SEU CONTROL

[75] Inventors: Michael S. Liu, Bloomington; Gordon A. Shaw, Plymouth; Jerry Yue, Roseville, all of Minn.

[73] Assignee: Honeywell Inc., Minneapolis, Minn.

[21] Appl. No.: 807,307

[22] Filed: Dec. 13, 1991

[51] Int. Cl.$^5$ .................. H01L 21/70; H01L 27/00
[52] U.S. Cl. ........................... 437/60; 437/47; 257/154; 257/350
[58] Field of Search ............ 437/60, 47; 257/154, 257/350

[56] References Cited

U.S. PATENT DOCUMENTS

| | | | |
|---|---|---|---|
| 4,370,798 | 2/1983 | Lien et al. | 437/60 |
| 4,387,580 | 1/1983 | Guterman | 437/60 |
| 4,408,385 | 10/1983 | Mohan Rao et al. | 437/60 |
| 4,541,002 | 9/1985 | Shimada | 357/51 |
| 4,579,600 | 4/1986 | Shah et al. | 148/1.5 |
| 4,584,026 | 4/1986 | Wu et al. | 148/1.5 |
| 4,592,120 | 6/1986 | Glang et al. | 437/60 |
| 4,652,334 | 3/1987 | Jain et al. | 156/628 |
| 4,727,045 | 2/1988 | Cheung et al. | 437/60 |
| 4,748,131 | 5/1988 | Zietbow | 437/24 |
| 4,785,342 | 11/1988 | Yamaraka et al. | 357/51 |
| 4,916,507 | 4/1990 | Boudou et al. | 437/60 |
| 4,948,747 | 8/1990 | Pfiester | 437/228 |
| 4,950,620 | 8/1990 | Harrington, III | 437/60 |
| 4,965,214 | 10/1990 | Choi et al. | 437/60 |
| 5,024,954 | 6/1991 | Chen et al. | 437/24 |
| 5,068,201 | 11/1991 | Spinner, III et al. | 437/60 |

Primary Examiner—Olik Chaudhuri
Assistant Examiner—Long Pham
Attorney, Agent, or Firm—Gregory A. Bruns

[57] ABSTRACT

A method for fabricating polysilicon resistors of intermediate high value for use as cross-coupling or =ingle event upset (SEU) resistors in memory cells. A thin polysilicon film is implanted with arsenic ions to produce a predetermined resistivity. The thin film is then implanted with fluorine ions to stabilize the grain boundaries and thereby the barrier height. Reducing the variation in barrier height from run to run of wafers allows the fabrication of reproducible SEU resistors.

16 Claims, 3 Drawing Sheets

FABRICATION OF STABILIZED POLYSILICON RESISTORS FOR SEU CONTROL

BACKGROUND OF THE INVENTION

The present invention relates generally to semiconductor devices and particularly to the fabrication of relatively high value polysilicon resistors for use in static random access memory cells.

Single event upset (SEU) is a phenomenon in which a localized photo-current pulse is produced by a charged particle incident on the sensitive node of a storage element or memory cell causing it to upset when the collected charge is larger than the critical charge for upset. An effective method to reduce susceptability to SEU is to increase the critical charge required for upset by placing large cross-coupling resistors in the storage element to increase the RC time constant delay associated with the gate capacitances of the transistors of the storage element. These cross-coupling or SEU resistors have typically been polysilicon implanted with arsenic, boron or phosphorus ions to achieve a desired resistivity. One example of the variation of measured resistivity values at 25° C. for polysilicon having an arsenic implant at 60 Kev and dose ranging from $2 \times 10^{14}$ to $8 \times 10^{14}$ cm$^{-2}$ is shown in FIG. 5.

Further background follows with reference to FIG. 1 which illustrates a conventional six transistor CMOS static memory cell, typically used in a static random access memory (SRAM). Memory cell 10 uses cross-coupled CMOS inverters. CMOS inverter 12 includes P-channel transistor 14 and n-channel transistor 16 with their source to drain paths connected in series between Vcc and ground and their gates connected together. Second CMOS inverter 18 has p-channel transistor 22 and n- channel transistor 24 having their source-to drain paths connected in series between Vcc and ground and their gates common.

The susceptability of a memory cell to upset may be reduced by increasing the critical charge of the cell. As shown in FIG. 1 resistors 20 and 30 are included in the cross coupling lines of inverters 12 and 18. Resistor 20 is connected between the common gate connection of inverter 12 and the common drain connection of inverter 18. Resistor 30 is connected between the common gate connection of inverter 18 and the common drain connection of inverter 12. SEU resistors 20 and 30 increase the RC time constant delay associated with the gate capacitances of transistors 14, 16, 22, and 24. The required resistance value for SEU resistors depends on the particular design, however resistivity values from 50 kilohm/sq. to 250 kilohm/sq. are often required. For many applications the resistivity must be reproducible for temperatures between $-55°$ and $125°$ C. Experience with arsenic implanted polysilicon SEU resistors in this resistance range has shown variations of 50% or more in resistance values for resistors from different lots. Thus a need exists for a process of making SEU resistors that is reproducible from lot to lot or run to run of wafers.

SUMMARY OF TUE INVENTION

The present invention solves these and other needs by providing an effective method of stabilizing SEU resistor values.

A field oxide region separates the common gate region from an interconnected region. A first polysilicon layer is deposited and a cut is made through the first polysilicon layer at the field oxide to define a resistor region. A second thin polysilicon layer is deposited and then implanted with arsenic ions to achieve a desired resistivity. Fluorine ions are then implanted to stabilize the grain boundaries and the subsequent normal semiconductor process continues.

DESCRIPTION OF THE PREFERRED EMBODIMENT

The present invention is directed toward a process for making polysilicon SEU resistors that is reproducible from lot to lot.

The variability of the sheet resistivity $r_s$ of polysilicon can be described by $$\frac{\Delta r_s}{r_s} = \sqrt{\left[\left(\frac{\Delta t}{t}\right)^2 + \left(\frac{\Delta N}{N}\right)^2 + \left(\frac{\Delta L}{L}\right)^2 + \left(\frac{\Delta q}{KT}\Delta V_b\right)^2\right]} \qquad (1)$$

where t=thickness of the conducting layer of polysilicon (cm)
N=doping density (cm$^{-3}$)
L=grain size (cm)
T=absolute temperature (°K$^{-1}$)
Vb=barrier height (volts)
q=electron charge
k=Boltzmann constant Comparing the terms in equation (1) it can be seen that the greatest variations are likely to occur in the last term of equation (1) where variations in barrier height (Vb) are multiplied by a factor q/kT which is approximately 40 at room temperature.

The process variables affecting the barrier height are grain size, the doping and the trap density. The trap density does not appear in equation (1), but it is known to have a strong influence on barrier height.

Figure 1:
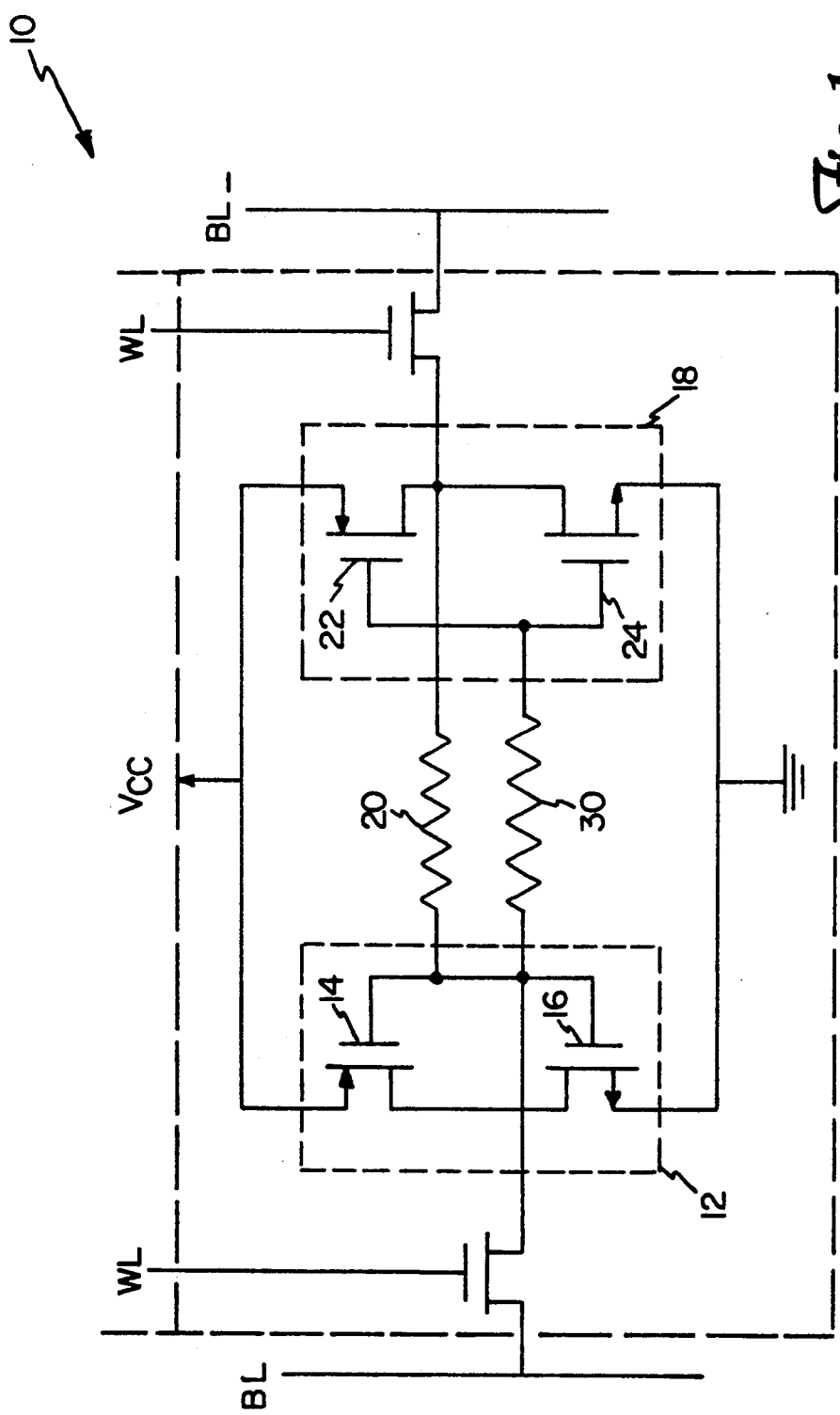
FIG. 1 is a schematic of a CMOS static random access memory cell.
Figure 2:
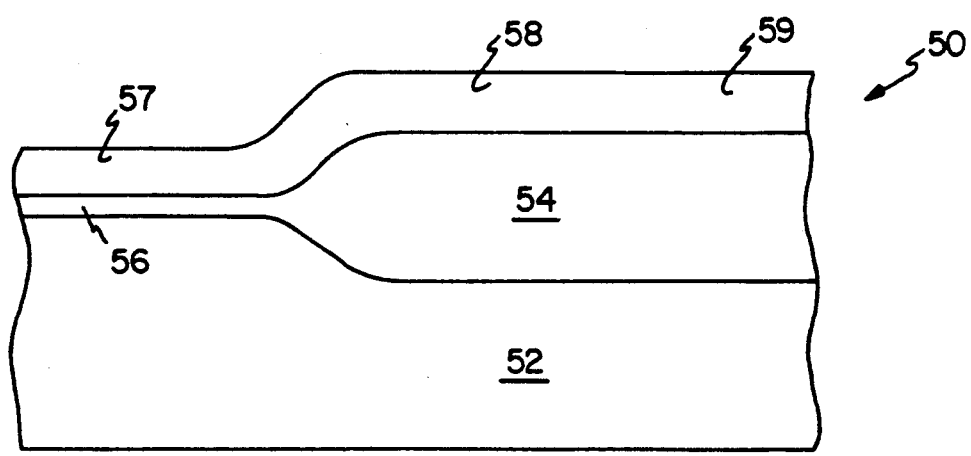
FIGS. 2–4 are enlarged cross-section drawings of a portion of a CMOS static random access memory cell in accordance with the present invention.
Figure 3:
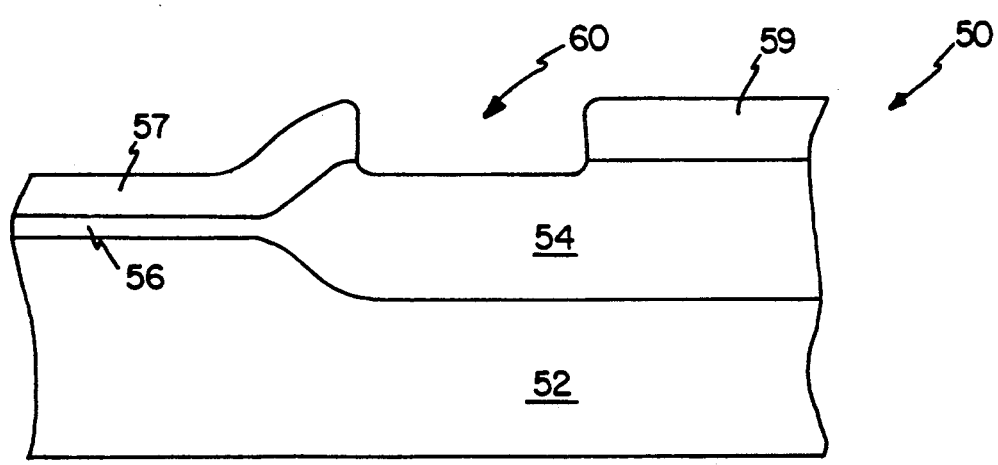

Referring to FIG. 2 of the drawings, a partial crossection of a semiconductor device 50 is shown in an intermediate stage of fabrication. Partial cross-section 50 is used to illustrate the fabrication of an SEU resistor, such as resistor 20 or 30 of FIG. 1. A field oxide layer 54 has been grown on silicon substrate 52. Field oxide 54 has been grown by a reduced bird's beak local oxidation process. Field oxide 54 defines the active area and the field area. A thin oxide 56, is then grown, typically to a thickness of 150 to 250 angstroms for use as the gate oxide in for example transistor 14 of inverter 12 of memory cell 10.

FIG. 2 also illustrates a first polysilicon deposition layer 58. The thickness of polysilicon layer 58 is not critical and a thickness of 3500 to 4500 angstrom has been found satisfactory. Polysilicon layer 58 is deposited by using low pressure CVD and is then doped N+ through the use of the POCL$_3$ process. This results in a phosphorus doped polysilicon and a phosphorus doped glass layer which is removed by known methods. Polysilicon layer 58 includes a gate portion 57 and an interconnected region 59. Interconnected region 59 will subsequently be connected to the common drain connection of for example inverter 18.

Following the N+doping of polysilicon layer 58, it is necessary to mask polysilicon layer 58 and etch it to define an SEU resistor region 60 as illustrated in FIG. 2. The depth of the etching should extend slightly into field oxide area 54.

Figure 4:
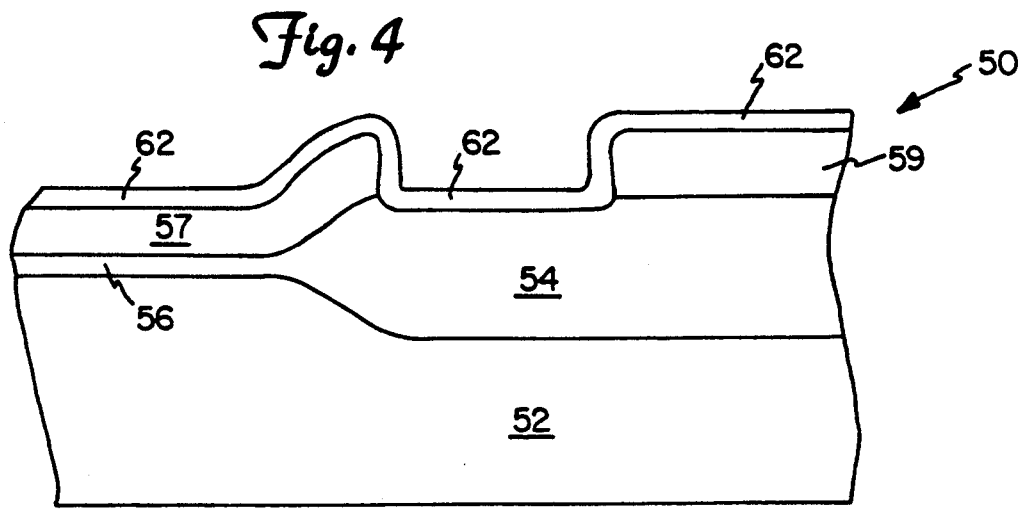
Figure 5:
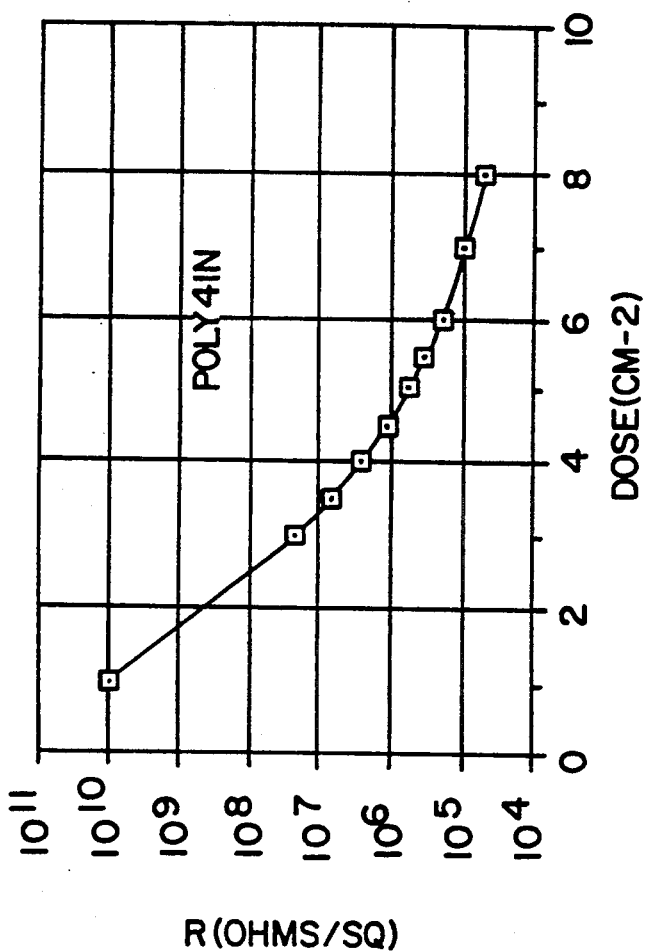
FIG. 5 shows the variation of the resistivity and the dose of implanted Arsenic at temperature of 25° C.

A second polysilicon deposition is made using low pressure CVD at approximately 610 degrees C and results in layer 62 as illustrated in FIG. 4. Polysilicon layer 62 typically has a thickness of 1000 to 1500 angstroms. FIG. 4 illustrates a thin second layer of polysilicon 62 within resistor region 60.

Following the deposition of second polysilicon 62, an arsenic implant without a mask is performed at an implant energy of approximately 50 to 70 Kev and a dose of approximately $3 \times 10^{14}$ to $6 \times 10^{14}$ per cm$^{-2}$. This implant into second polysilicon 62 is designed to create a SEU resistor having a predetermined resistivity value in resistor region 60.

This is followed by a fluorine ion implant without a mask which is performed at an implant energy of approximately 20 to 30 Kev and a dose of approximately $0.6 \times 10^{15}$ to $1.5 \times 10^{15}$ ions per cm$^{-2}$.

After the fluorine implant, the usual subsequent semiconductor processing may continue. Following the source-drain implant an annealing process may be performed at approximately 900 degrees C.

After the processes described, an SEU resistor is on second poly layer 62 which has been doped with arsenic and fluorine so that the characteristics of the resistors will be controlled by the doping of the grains with stabilized grain boundaries.

Barrier height was measured by the temperature dependence of the sheet resistivity of polysilicon samples. The measurement can be done with a temperature controlled chuck which is set up for a high resistivity type of four-point probe station. For this measurement a range of 20° C. to 125° C. was used and the resistivity data was then fitted to the exponential function. From the slope, the barrier height can be derived.

Apparently the traps located at the grain boundaries modify barrier height and strongly influence the electrical properties of polysilicon. The traps are associated with dangling bonds at the grain boundaries. These dangling bonds could be passivated with hydrogen or fluorine. Experiments with hydrogen showed that the barrier height was reduced; however the uniformity across a wafer was very poor with hydrogen and variations of more than 100% were observed.

The use of a fluorine implant as in the present invention results in a much more reproducible resistor. This is apparently explained by the fluorine silicon bond strength of 5.0 eV resulting in a much firmer bond than the hydrogen-silicon bond strength of 3.1 eV.

An additional advantage of the present invention is that the fluorine implant which is performed at approximately the same time as the arsenic implant can go through a later higher temperature annealing process than would be feasible with a hydrogen implant.

To illustrate the control technique of minimizing the variation of barrier height using fluorine passivation for grain boundaries, a collection of wafers from different depositions was processed. A total of 20 wafers from 10 different lots in a span of of two to three months was processed. The measured resistance values at 5 locations for each of the wafers is shown in Table 1. The average resistance value is shown in Column G and variation from the average is less than 8%.

TABLE 1

| WAF# | TOP | CENTER | FLAT | LEFT | RIGHT | AVG |
|---|---|---|---|---|---|---|
| 1 | 104000 | 100000 | 105000 | 111000 | 97000 | 103400 |
| 2 | 131000 | 129000 | 140000 | 136000 | 125000 | 132200 |
| 3 | 99000 | 94000 | 96000 | 99000 | 97000 | 97000 |
| 4 | 139000 | 124000 | 131000 | 140000 | 126000 | 132000 |
| 5 | 109000 | 106000 | 112000 | 116000 | 112000 | 111000 |
| 6 | 146000 | 145000 | 147000 | 155000 | 146000 | 147800 |
| 7 | 119000 | 107000 | 115000 | 122000 | 113000 | 115200 |
| 8 | 141000 | 138000 | 150000 | 147000 | 143000 | 143800 |
| 9 | 93000 | 88000 | 89000 | 96000 | 96000 | 92400 |
| 10 | 134000 | 132000 | 134000 | 142000 | 141000 | 136600 |
| 11 | 105000 | 102000 | 111000 | 100000 | 110000 | 105600 |
| 12 | 131000 | 129000 | 141000 | 134000 | 134000 | 133800 |
| 13 | 110000 | 108000 | 112000 | 113000 | 110000 | 110600 |
| 14 | 153000 | 145000 | 159000 | 155000 | 159000 | 154200 |
| 15 | 98000 | 93600 | 98000 | 96300 | 98200 | 96820 |
| 16 | 116000 | 110000 | 115000 | 122000 | 119000 | 116400 |
| 17 | 117000 | 115000 | 112000 | 122000 | 117000 | 116600 |
| 18 | 125000 | 119000 | 121000 | 122000 | 135000 | 124400 |
| 19 | 117000 | 106000 | 115000 | 107000 | 109000 | 110800 |
| 20 | 145000 | 138000 | 146000 | 148000 | 142000 | 143800 |

In accordance with the foregoing description, Applicants have developed a method of fabricating SEU resistors that may be easily incorporated into the design of static random access memory cells intended for radiation environments. Although a specific embodiment of the Applicant's method is shown and described for illustrative purposes, a number of variations and modifications will be apparent to those of ordinary skill in the relevant arts. It is not intended that coverage be limited to the disclosed embodiment, but only by the terms of the following claims.

We claim:

1. A method for fabricating a polysilicon resistor for use as a cross-coupling resistor in a CMOS static random access memory cell, comprising the following steps:

providing a semiconductor substrate;

growing a field oxide layer on said substrate, said field oxide separating a gate region from an interconnected region;

growing a gate oxide;

depositing a first polysilicon layer;

masking and etching a resistor region in said first polysilicon layer at said field oxide layer;

depositing a second polysilicon layer:

implanting arsenic ions in said second polysilicon layer at said resistor region to form a resistor having a predetermined resistance value;

implanting fluorine ions in said second polysilicon layer at said resistance region to stabilize said resistance value; and performing subsequent semiconductor processes.

2. The method of claim 1 wherein said second polysilicon layer has a thickness of about 1500 to 2000 angstroms.

3. The method of claim 2 wherein said arsenic ions are implanted with a dose level in the range of $3 \times 10^{14}$ to $6 \times 10^{14}$ ions/cm$^2$ and an energy level in the range of 50 KeV to 70 Kev.

4. The method of claim 3 wherein said fluorine ions are implanted with a dose level in the range of $0.6 \times 10^{15}$ to $1.5 \times 10^{15}$ ions/cm$^2$ and an energy level in the range of 20 KeV to 30 KeV.

5. In a method for fabricating a polysilicon resistor for use as a cross-coupling resistor in a CMOS static random access memory cell formed on a semiconductor substrate and having a first inverter and a second inverter with said cross-coupling resistor electrically connected between a common gate region of said first inverter and a common drain connection of said second inverter, the improvement of making said polysilicon resistor more reproducible, comprising the following steps:

growing a field oxide layer on said substrate, said field oxide defining a gate region;, and an interconnected region;

growing a gate oxide;

depositing a first polysilicon layer;

masking and etching a resistor region in said first polysilicon layer at said field oxide layer;

depositing a second polysilicon layer:

implanting impurities in said second polysilicon layer at said resistor region to achieve a predetermined resistivity value;

implanting fluorine ions in said second polysilicon layer to stabilize said resistivity value; and performing subsequent semiconductor processing steps.

6. The method of claim 5 wherein said second polysilicon layer has a thickness of about 1000 to 1500 angstroms.

7. The method of claim 6 wherein said impurities are arsenic ions and said arsenic ions are implanted with a dose level in the range of $3 \times 10^{14}$ to $6 \times 10^{14}$ ions/cm$^2$ and an energy level in the range of 50 KeV to 70 KeV.

8. The method of claim 7 wherein said fluorine ions are implanted with a dose level in the range of $0.6 \times 10^{15}$ to $1.5 \times 10^{15}$ ions/cm$^2$ and an energy level in the range of 20 KeV to 30 KeV.

9. A method for fabricating a polysilicon resistor for use as a cross-coupling resistor in a CMOS static random access memory cell, comprising the following steps:

providing a semiconductor substrate;

growing a field oxide layer on said substrate, said field oxide separating a gate region form an interconnected region;

growing a gate oxide;

depositing a first polysilicon layer;

masking and etching a resistor region in said first polysilicon layer at said field oxide layer;

depositing a second polysilicon layer:

implanting impurity ions in said second polysilicon layer at said resistor region to form a resistor having a predetermined resistance value;

implanting fluorine ions in said second polysilicon layer at said resistance region to stabilize said resistance value; and performing subsequent semiconductor processes.

10. The method of claim 9 wherein said impurity ions are selected from the group consisting of arsenic, boron, and phosphorous.

11. The method of claim 10 wherein said impurity ions are arsenic.

12. The method of claim 11 wherein said arsenic ions are implanted with a dose level in the range of $3 \times 10^{14}$ to $6 \times 10^{14}$ ions/cm$^2$ and an energy level in the range of 50 KeV to 70 KeV.

13. The method of claim 12 wherein said fluorine ions are implanted with a dose level in the range of $0.6 \times 10 = 1^5$ to $1.5 \times 10^{15}$ ions/cm$^2$ and an energy level in the range of 20 KeV to 30 KeV.

14. The method of claim 9 wherein said second polysilicon layer has a thickness of about 1500 to about 2000 angstroms.

15. The method of claim 9 wherein said fluorine ions are implanted at approximately the same time as said impurity ions are implanted.

16. The method of claim 14 wherein said fluorine ions are implanted at approximately the same time as said arsenic ions are implanted.

* * * * *